United States Patent
Suzuki et al.

(10) Patent No.: US 6,976,138 B2
(45) Date of Patent: Dec. 13, 2005

(54) SEMICONDUCTOR DEVICE FOR DATA COMMUNICATION CONTROL AND RADIO COMMUNICATION APPARATUS

(75) Inventors: May Suzuki, Kokubunji (JP); Takashi Aoyama, Yokohama (JP)

(73) Assignees: Renesas Technology Corporation, Tokyo (JP); Hitachi Communication Systems, Inc., Kanagawa (JP)

( * ) Notice: Subject to any disclaimer, the term of this patent is extended or adjusted under 35 U.S.C. 154(b) by 665 days.

(21) Appl. No.: 09/984,675

(22) Filed: Oct. 30, 2001

(65) Prior Publication Data

US 2002/0053052 A1 May 2, 2002

(30) Foreign Application Priority Data

Oct. 30, 2000 (JP) .................. P2000-334922

(51) Int. Cl.[7] .............................. G06F 12/06
(52) U.S. Cl. ...................................... 711/157
(58) Field of Search .................. 711/157, 217, 127

(56) References Cited

U.S. PATENT DOCUMENTS 5,991,857 A * 11/1999 Koetje et al. ............... 711/157
6,321,311 B1 * 11/2001 Kim ........................... 711/157
6,543,013 B1 * 4/2003 Li et al. ..................... 714/701
6,668,343 B1 * 12/2003 Kim et al. .................. 714/702
6,732,316 B1 * 5/2004 Tong et al. ................. 714/756
6,748,560 B2 * 6/2004 Hatakeyama ............... 714/702
6,788,617 B1 * 9/2004 Lee ............................ 365/240

FOREIGN PATENT DOCUMENTS

JP 52-153303 6/1976
JP 06-061873 8/1992

OTHER PUBLICATIONS

3rd Generation Partnership Project; Technical Specification Group Radio Access Network; Multiplexing and channel coding (FDD) (Release 1999), 3GPP TS 25.212 v3.6.0 (Jun. 2001), pp. 1-4, 20-23.

* cited by examiner

Primary Examiner—Kevin L. Ellis
(74) Attorney, Agent, or Firm—Reed Smith LLP; Stanley P. Fisher, Esq.; Juan Carlos A. Marquez, Esq.

(57) ABSTRACT

The required RAM capacity is reduced by dividing an interleaving RAM in a baseband modulator into a plurality of areas and having the read side and the write side use some common areas on a time-sharing basis.

38 Claims, 14 Drawing Sheets

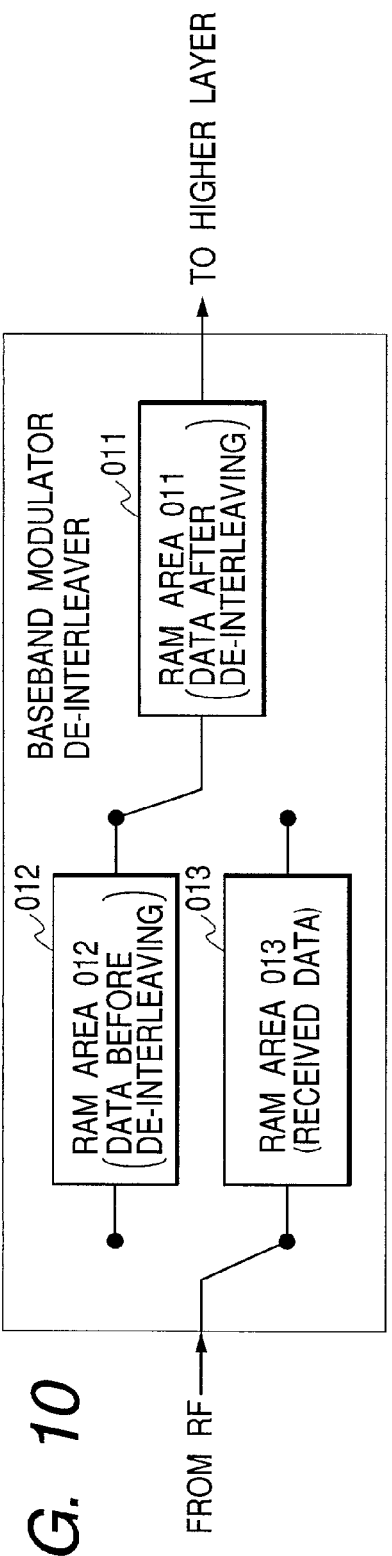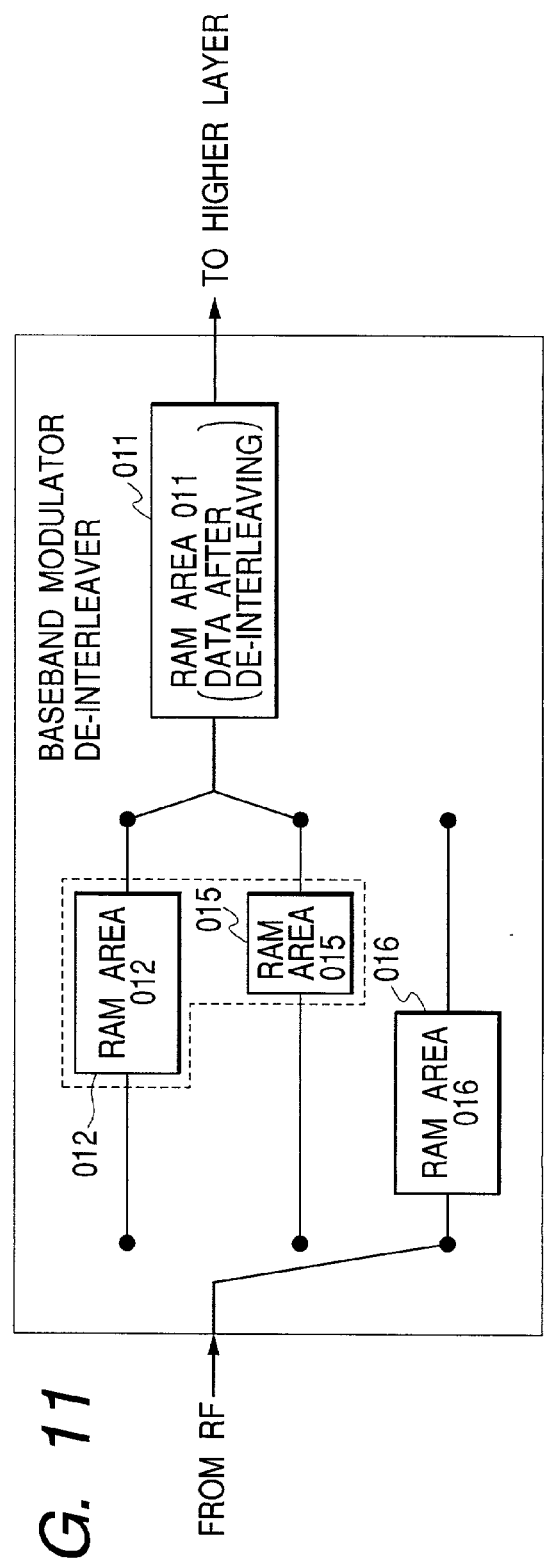

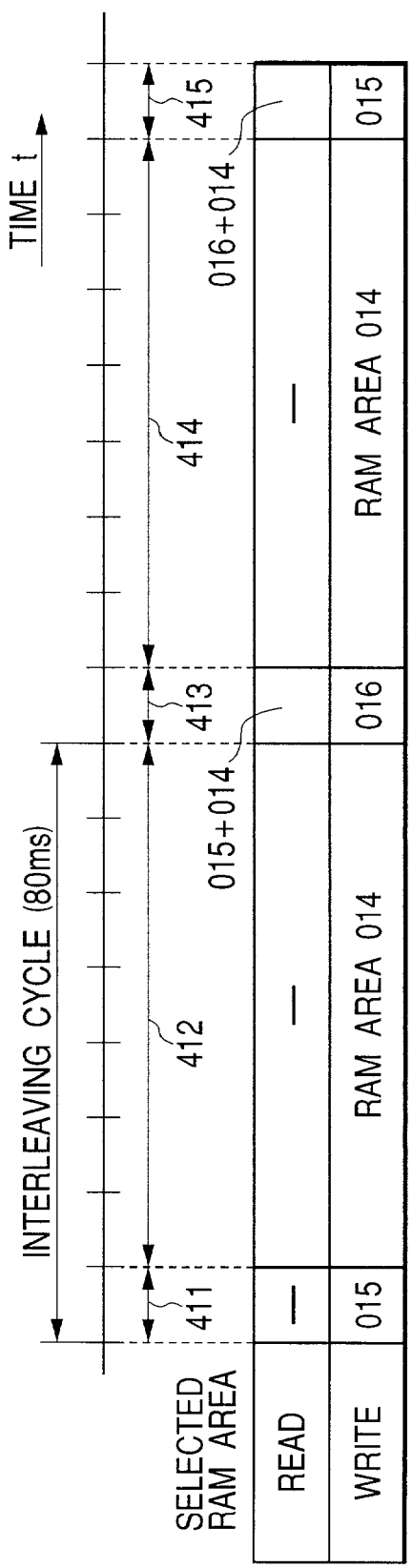

SEMICONDUCTOR DEVICE FOR DATA COMMUNICATION CONTROL AND RADIO COMMUNICATION APPARATUS

BACKGROUND OF THE INVENTION

1. Field of the Invention

The present invention relates to hardware configurations of communication apparatuses (at the base station and terminals) employing communication method using an interleaving or de-interleaving efficiency in the processes of modulation and demodulation. The invention is particularly advantageous for communication apparatuses for mobile communication supporting a code division multiple access (CDMA) protocol.

2. Description of Related Art

Interleaving is a technique for transmitting data in a way less susceptible to errors occurring in a burst manner on a transmission path by rearranging the data in a prescribed pattern. It is extensively used in a wide variety of communications, such as mobile communication and Internet communication.

Standards developed under the Third Generation Partnership Project ("3GPP"), an international standardization body for mobile communication systems supporting a wide band code division multiple access (W-CDMA) protocol, also apply the interleaving technique. FIG. 1 illustrates a RAM configuration based on the 3GPP according to the prior art, and FIG. 2 is a conceptual diagram of the interleaving technique which illustrates the effect of error correction.

The interleaving processing according to the 3GPP standard is characteristic in that, while the usual transmission frame unit is 10 ms, data are rearranged in a long period up to 80 ms. To rearrange their transmitting sequence, data delivered from their origin are spooled in a RAM area 001. When they are written into the RAM area 001, the address is incremented in the usual order of 1, 2, 3, etc. Data are written in every 30 of each line as shown in FIG. 2. When an 80 ms equivalent length of data have accumulated, the read sequence is varied to 1, 31, 61 etc., i.e., the data are read out at the interval of 30 (by row) then copied into another RAM area 002. The sequence of the columns to be read is varied at random with reference to a prescribed pattern.

The transmission of data in such a rearranged sequence makes it easier for the error correction code to exert its effect. Even if many errors are locally generated by noise or the like on the transmission path as shown in FIG. 2, the rearrangement of the data into the original sequence on the receiving side (which is known as de-interleaving) disperses the error locations. For instance, where a convolutional code of a ⅓ rate is used, information of each original datum is stretched to three data, and accordingly if all the three become erroneous, no decoding will be possible. But if only one of the three runs into an error, restoration can be done with high accuracy.

SUMMARY OF THE INVENTION

In order to continue transmission without interruption along with the above-described interleaving processing, it is necessary to write in a subsequent set of data into a portion of an area 013 where a portion of a first set of data currently being read out for interleaving. When the data being de-interleaved on the receiving side, as shown in FIG. 10, the received data are first written into the RAM area 012 and, when data equivalent to one de-interleaving cycle are accumulated, they are written into the RAM area 013. While the data are being written into the RAM area 013, the data in the RAM area 011 are de-interleaved, and the result is written into the RAM area 011. The receiving side also needs a similar RAM configuration to that on the transmitting side. Both the transmitting side and the receiving side require 80 ms×3 RAM areas each. To tentatively estimate the RAM capacity, as the data before spreading are one bit wide in interleaving by the transmission system, where the data are to be transmitted at a rate of 384 kbits/s, the RAM requirement will be 384 kbits/s×3 (turbo coding rate)×80 ms×3 =about 300 kbits. During the de-interleaving processing by the receiving system, data after the soft decision processing are decoded. These data after soft decision have a multi-bit width. Assuming that the width is four bits, four times the number of bits in the transmission system, i.e. 1.2 Mbits of memory will be required. 1.5 Mbits of memory in total for the transmission and reception systems are required. If such a RAM for interleaving/de-interleaving is to be built into an LSI, it requires a much bigger chip area to provide large capacity of the RAM, which posts a major obstacle to reduce the chip size.

In order to solve the above-stated problem, attention was drawn to the sufficiently higher operating frequency of the baseband modulator (from 20 MHz to 150 MHz approximately) than the transmission/reception rate of data (usually from 15 kHz to 384 kHz approximately in W-CDMA). Thus, according to the present invention, the RAM for the interleaving processing is divided into a plurality of areas, and the required RAM capacity is reduced by using on a time-sharing common area for reading and writing. The same configuration is used for the de-interleaving processing, thus the RAM capacities on both the transmission and the reception sides are thereby reduced.

Other and further objects, features and advantages of the invention will appear more fully from the following description.

BRIEF DESCRIPTION OF THE DRAWINGS

Preferred embodiments of the present invention are illustrated in the accompanying drawings in which:

FIG. 10 illustrates a typical configuration of a de-interleaving RAM according to the prior art;

FIG. 11 illustrates one embodiment of the configuration of a de-interleaving RAM according to the present invention;

FIG. 12 illustrates one embodiment of the present invention for scheduling the de-interleaving processing and selecting a RAM in the configuration of the de-interleaving RAM shown in FIG. 11;

DESCRIPTION OF THE PREFERRED EMBODIMENTS

A preferred embodiment of the present invention will be described below.

Figure 1:
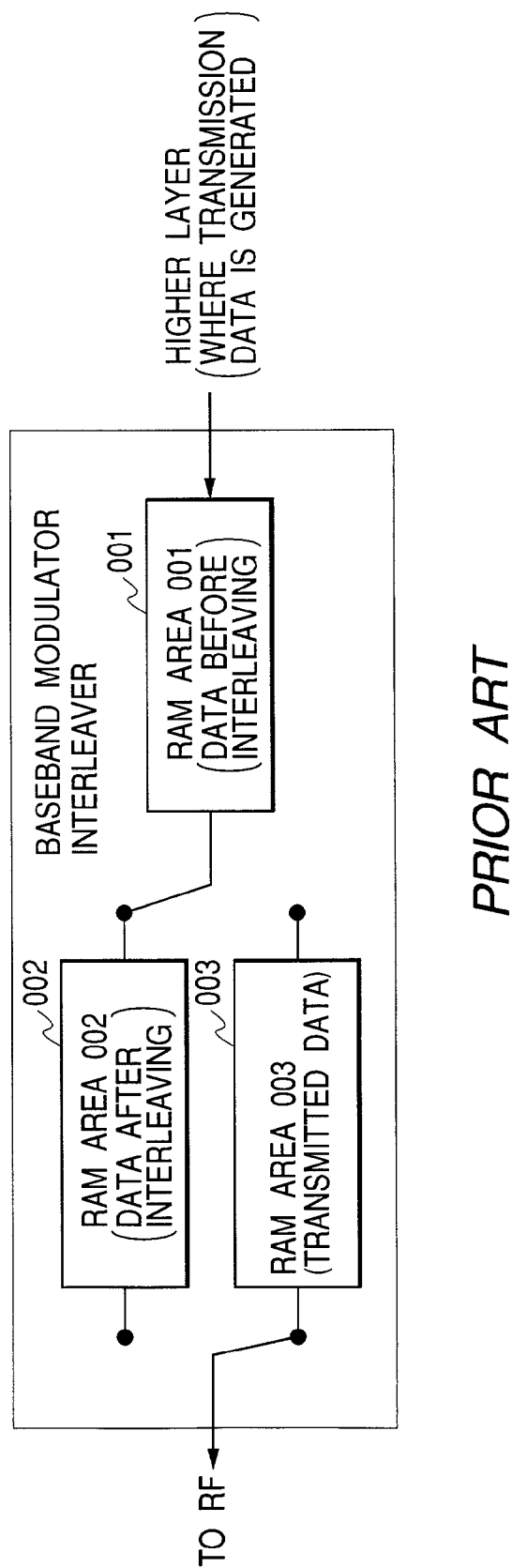
FIG. 1 illustrates a typical configuration of an interleaving RAM according to the prior art.
Figure 2:
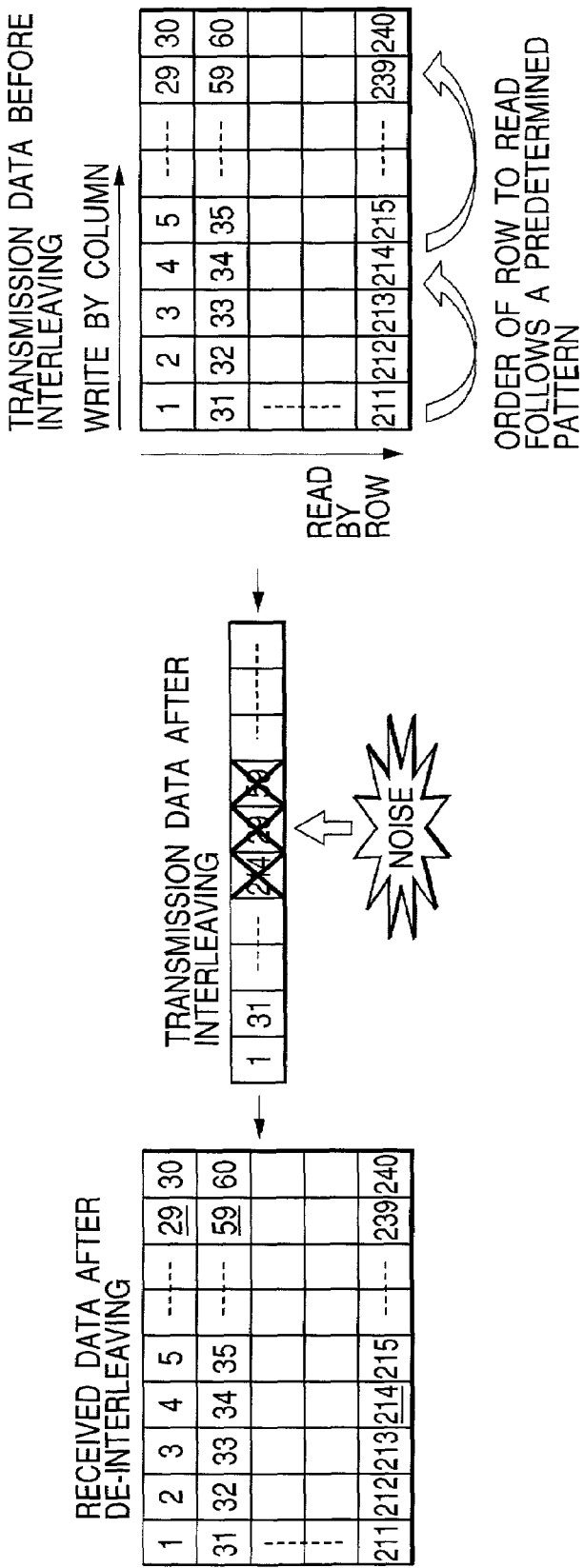
FIG. 2 illustrates the operation mechanism of the interleaving processing prescribed by the 3GPP standard and its effects.
Figure 3:
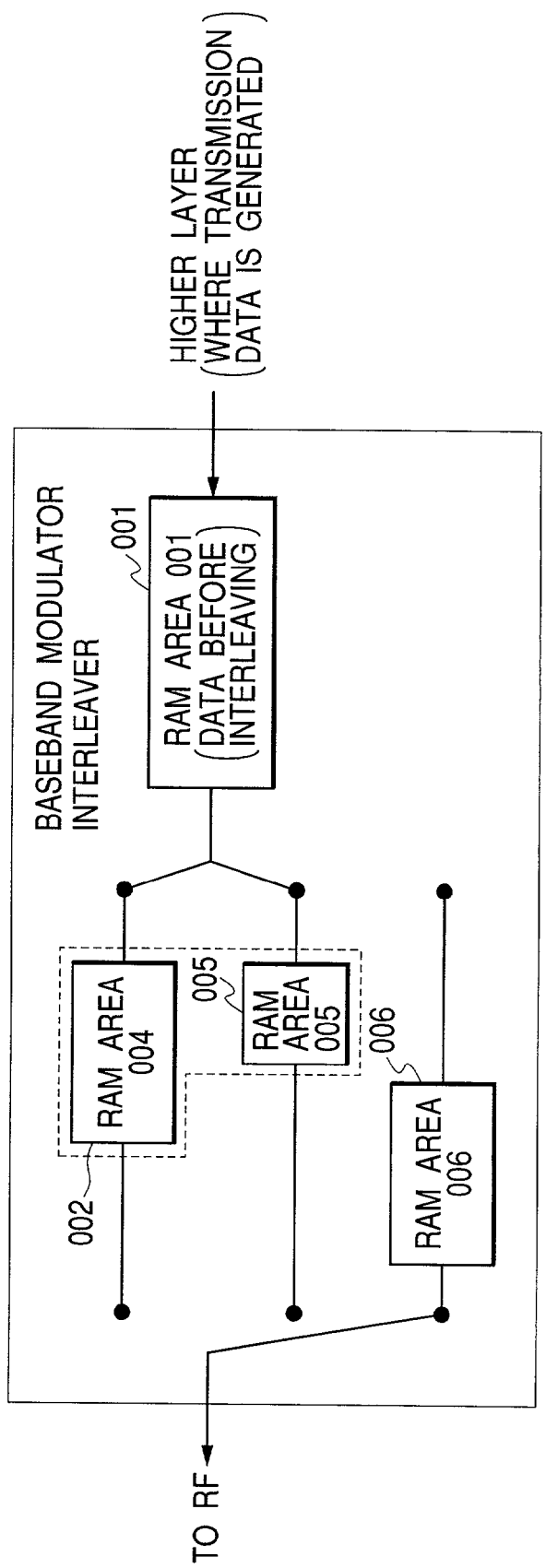
FIG. 3 illustrates a typical configuration of an interleaving RAM according to the present invention.

In the prior art shown in FIG. 1, if the interleaving cycle is 80 ms, when data of the final 10 ms of the 80 ms period are being read out, data of the other 70 ms in the RAM area 003 have already been read out. This point being taken note of, as shown in FIG. 3, the RAM area 003 is divided into a 70 ms equivalent length of memory (a RAM area 004 in FIG. 3) and a 10 ms equivalent length of memory (a RAM area 006 in FIG. 3) in this embodiment of the invention, and a RAM area 005 is another 10 ms equivalent length of memory. Thus, where the number of data contained in one transmitted/received frame is one unit, each of the RAM areas 004, 005 and 006 consists of a number of words equal to an integral multiple of that unit.

Figure 4:
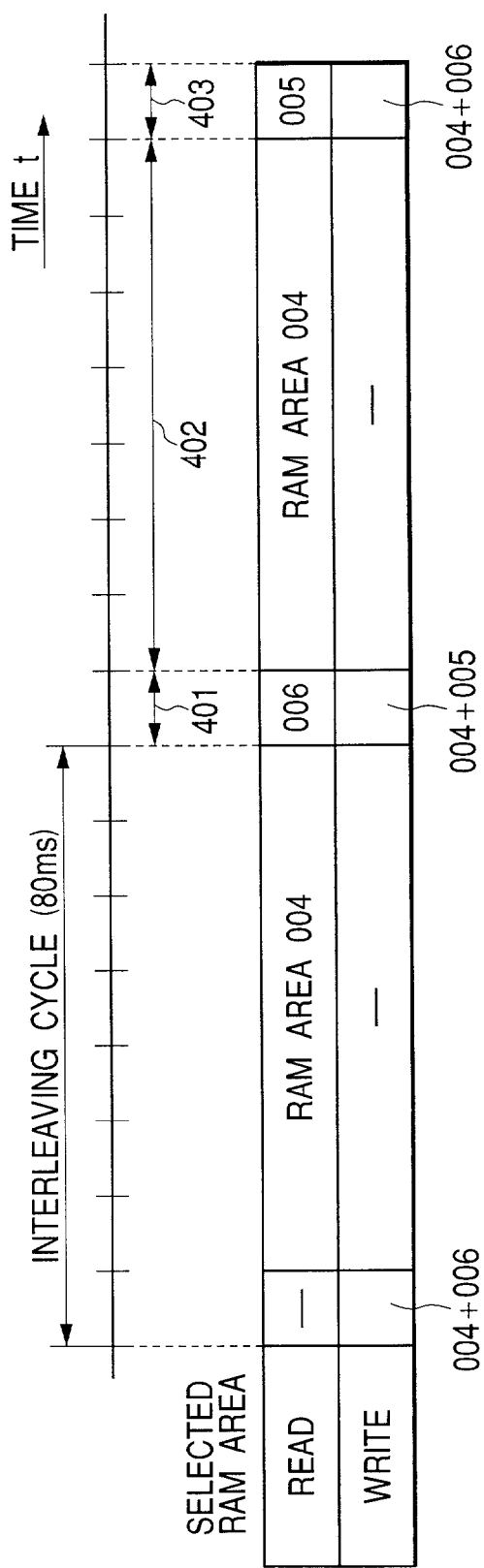
FIG. 4 illustrates one embodiment of the present invention for scheduling the interleaving processing and selecting a RAM in the configuration of the interleaving RAM shown in FIG. 3.

The timing of interleaving and the state of RAM selection are shown in FIG. 4. Out of the 80 ms of the interleaving cycle, the next data are interleaved in the final 10 ms (section 401 in the diagram); a 10 ms equivalent length of memory (the RAM area 006 in FIG. 3) is used on the reading side; and a 70 ms equivalent length of memory (the RAM area 004 in FIG. 3) and another 10 ms equivalent length of memory (the RAM area 005 in FIG. 4), or a total of 80 ms, are used on the interleaving side. Having completed reading out of the RAM area 006 (section 402 in the diagram), the RAM area 004 is selected on the reading side to access the data of the next 70 ms. No interleaving is done in that while, and any writing into any RAM is suspended. In the final 10 ms of the next cycle (section 403 in the diagram), the RAM area 005 is selected on the reading side, and data are written into the RAM area 004 and the RAM area 006 on the interleaving side.

By writing data in alternately varied combinations, the invention requires only 30% of the RAM required by the prior art, i.e., 80 ms×3 equivalent length of memory areas.

Each of the RAM areas 004, 005 and 006 may be built on a different semiconductor chip or on one single semiconductor chip.

The embodiment of the invention on the de-interleaving side will be described next. The configuration of the embodiment is shown in FIG. 11, and the timing of de-interleaving and the state of RAM selection are shown in FIG. 12. In this embodiment, data received from an RF unit are written into a RAM area 015 in the first 10 ms (section 411 in FIG. 12) and into a RAM area 014 in the next 70 ms (section 412 in FIG. 12). In the further next 10 ms (section 413 in FIG. 12), while the data are written into a RAM area 016, data equivalent to a total of 80 ms stored in the RAM areas 015 and 014 are de-interleaved, and the result is written into a RAM area 011. In the next 70 ms (section 414 in FIG. 12), data are written into the RAM area 014. In the further next 10 ms (section 415 in FIG. 12), while the data are written into the RAM area 015, data equivalent to a total of 80 ms stored in the RAM areas 016 and 014 are de-interleaved. The result is then written into the RAM area 011. By writing data in alternately varied combinations in such a manner, the RAM area requirement, which would be 80 ms×3 areas according to the prior art, can be reduced by about 30% in the de-interleaving RAM, too.

Each of the RAM areas 014, 015 and 016 may be built on a different semiconductor chip or on a single semiconductor chip. The de-interleaving RAM, as mentioned above, often takes on a multi-bit width after the soft decision processing, and also consumes a large memory capacity. As it occupies a large proportion of the total semiconductor chip memory area, building these RAMs on a different semiconductor chip as external memories can reduce the required semiconductor chip area on the first chip. By using ready-made components for the external memories, the area of the semiconductor chip dedicated for baseband modulation (custom ASIC), which is rather expensive to manufacture can be reduced. As a result the yield rate is increased which results in an overall cost reduction.

Figure 5:
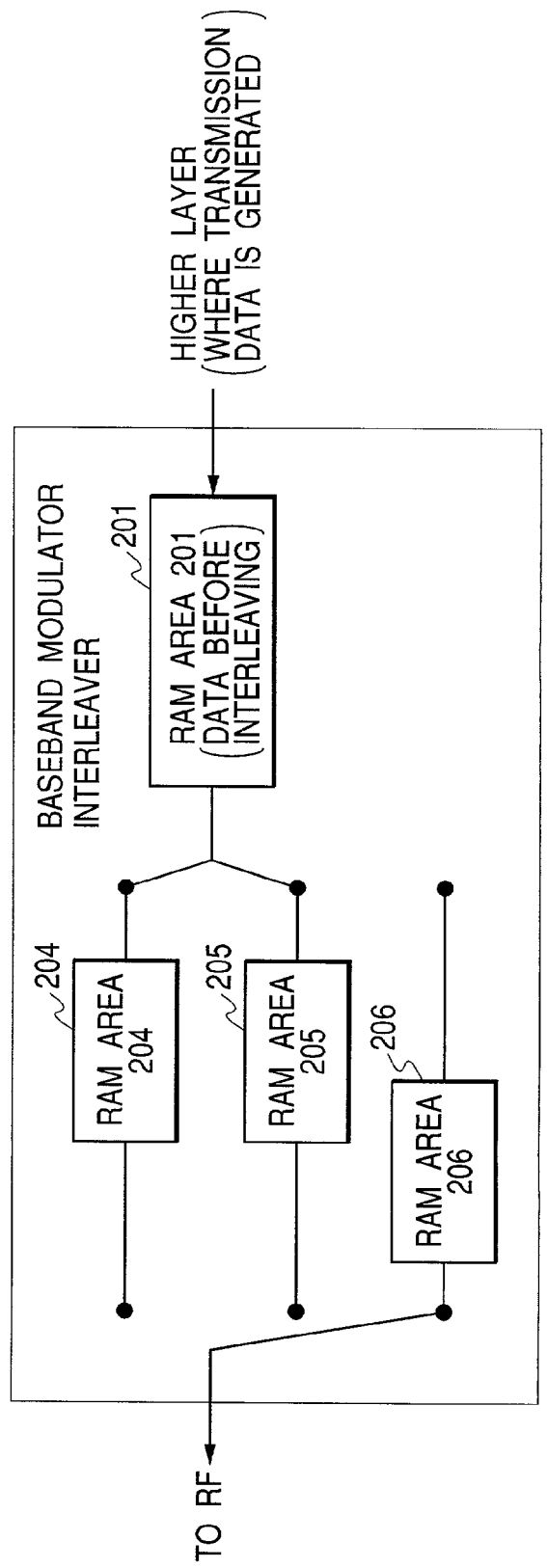
FIG. 5 illustrates a typical configuration of another embodiment of an interleaving RAM according to the invention.
Figure 6:
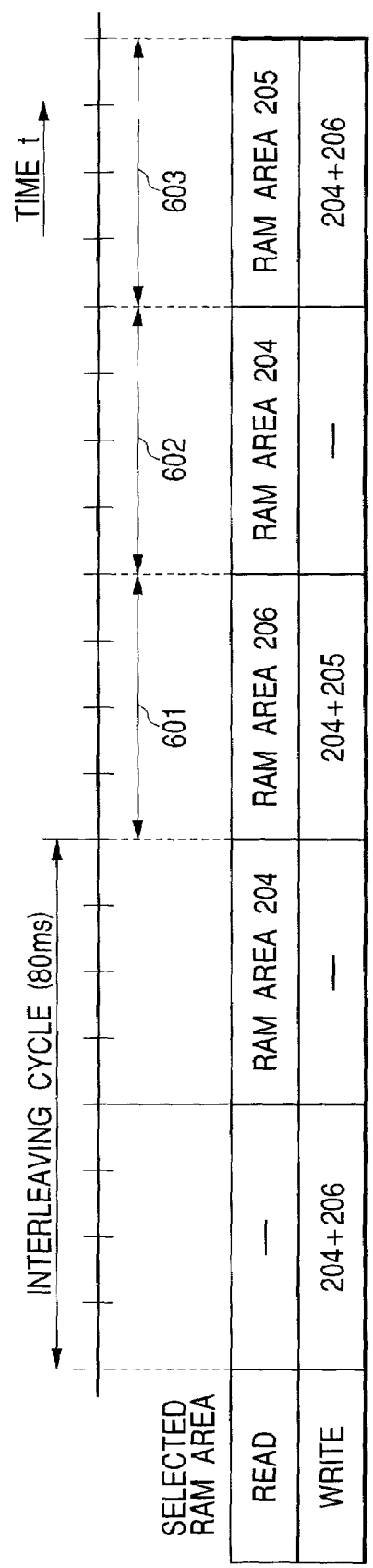
FIG. 6 illustrates another embodiment of the present invention for scheduling the interleaving processing and selecting a RAM in the configuration of the interleaving RAM shown in FIG. 5.

FIG. 5 illustrates another preferred embodiment of the present invention. Although the interleaving cycle is 80 ms, the same as in the first embodiment, the ratio of RAM area division is altered from 70 ms/10 ms to 40 ms/40 ms. Thus, in this embodiment, a RAM area 204 and a RAM area 205 are 40 ms each. A RAM area 201 is the same as the RAM area 001 described with reference to FIG. 3. For a RAM area 206, a 40 ms equivalent length of memory is sufficient. In such a configuration wherein the RAM division ratio is substantially equal, a longer time can be allowed for interleaving than in the first embodiment as shown in FIG. 6 although the rate of RAM capacity reduction drops to about 16%. Therefore, even if the operation efficiency of the interleaving circuit is only about two to three times the data transmission rate, it is possible to utilize the invention to reduce the required RAM capacity.

Figure 13:
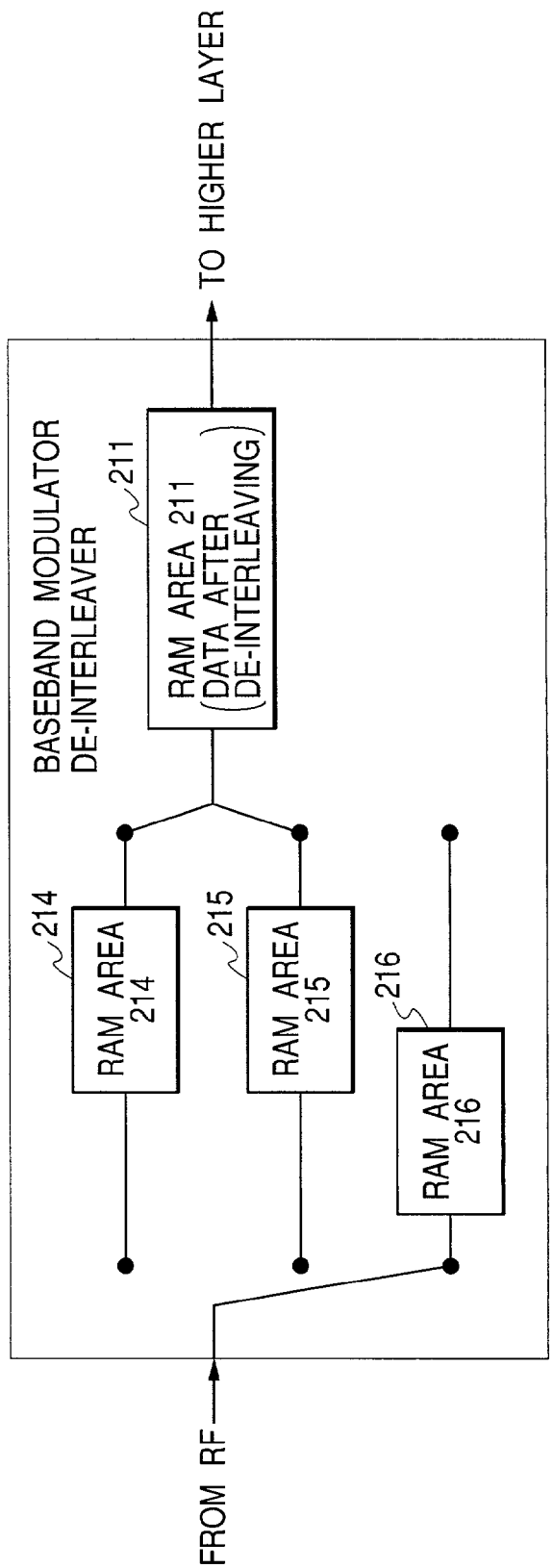
FIG. 13 illustrates another embodiment of the configuration of another de-interleaving RAM according to the invention.
Figure 14:
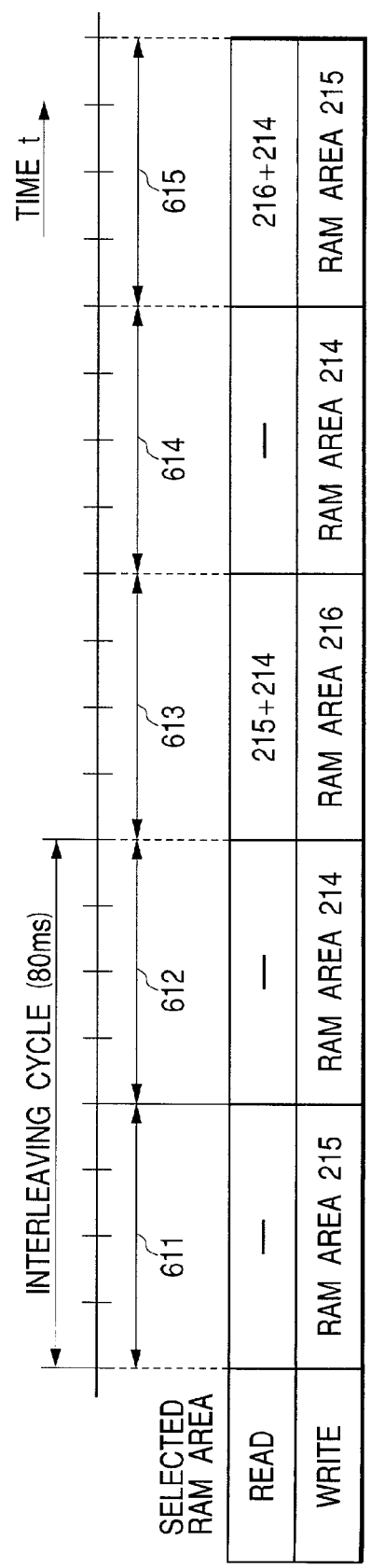
FIG. 14 illustrates another embodiment of the present invention for scheduling the de-interleaving processing and selecting a RAM in the configuration of the de-interleaving RAM shown in FIG. 13.

In the de-interleaving processing, the required RAM capacity is reduced with a similar configuration. The configuration of the above-described embodiment for de-interleaving is illustrated in FIG. 13, and the timing of the de-interleaving processing and the state of RAM selection are shown in FIG. 14.

One of the key features of this embodiment is that a first set of interleaved data are written into a combination of a first RAM area and a second RAM area and, when the next set of interleaved data are to be written, they are written into a combination of the first RAM area and a third RAM area. The invention alternately repeats a cycle comprising the two steps. The ratio between the quantity of data that is written into the first RAM area and the quantity that is written into the second RAM area can be set according to the data transmission/reception rate and the ratio of the operating frequencies of the interleaving circuits.

Figure 7:
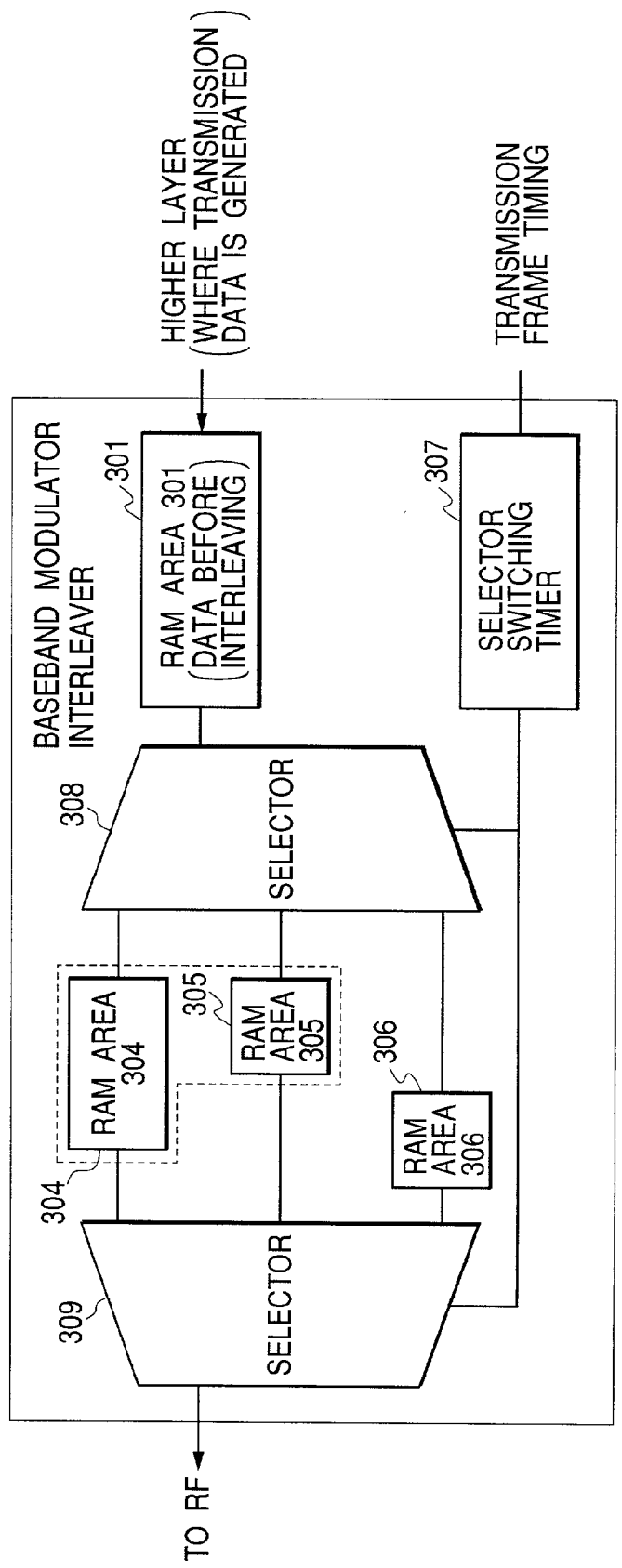
FIG. 7 illustrates a typical configuration of still another interleaving RAM of the present invention.

FIG. 7 illustrates still another embodiment of the present invention. In this embodiment, the interleaving cycle (ex. 10 ms×n) is an integral multiple of the transmission frame cycle (ex. 10 ms). A RAM area 301 is the same as the RAM area 001 described with reference to FIG. 3. Further, RAM areas 304, 305 and area 306 are the same as the RAM areas 004, 005 and 006 respectively as shown in FIG. 3 or the RAM areas 204, 205 and 206.

The selectors 308 and 309 select RAM areas according to a RAM switching signal supplied by a selector switching timer 307. A transmission frame timing signal is entered into the selector switching timer 307. The selector switching timer 307 generates a RAM switching signal with a counter for counting frame cycles. If, for instance, the RAM areas 304, 305 and 306 are the same as the RAM areas 004, 005 and 006 described with reference to FIG. 3, these areas store respectively 70 ms, 10 ms and 10 ms equivalents length of memory of data. Since they are integral multiples of the transmission frame cycle, the selecting actions of the selector are controlled with RAM switching signals generated by the counter for counting frame cycles.

RAM area selection can as well be accomplished by designating more significant bits (rather than MSBs) in the read or write address of the RAM to be selected. If, for instance, the RAM areas 304, 305 and 306 in FIG. 7 respectively have 1024, 512 and 512 words, the address of each individual RAM can be designated by 10 or less bits. If the address width is expanded by two bits, the RAM area to be selected is designated by the 11th and 12th bits.

Figure 15:
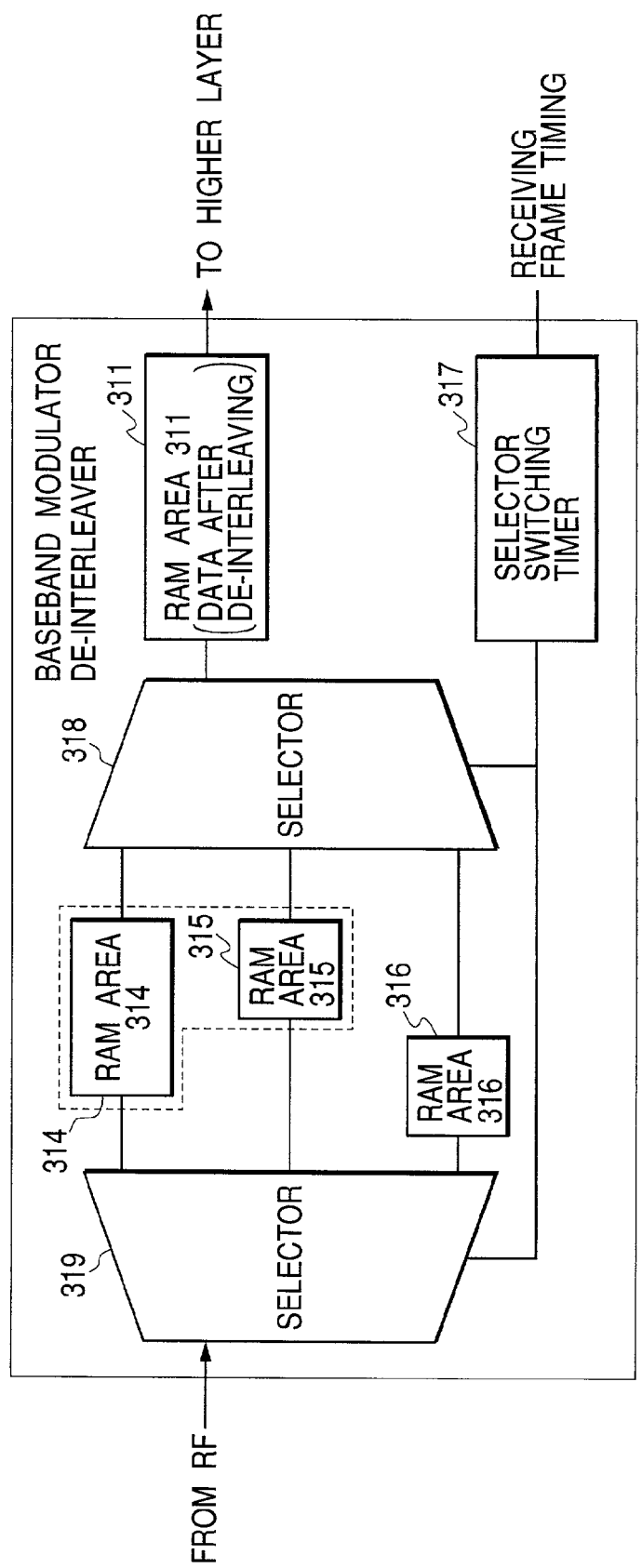
FIG. 15 illustrates another embodiment of the configuration of another de-interleaving RAM according to the invention.

FIG. 15 illustrates a de-interleaver processing, which is still another embodiment of the invention. The selectors 318 and 319 and a selector switching timer 317 function similarly to the selectors 308 and 309 and the selector switching timer 307 respectively (shown in FIG. 7).

The invention also applies the above-described interleaving/de-interleaving processings to the communication between a mobile terminal and a base station. The configurations of a mobile terminal and a base station will be described below.

Figure 8:
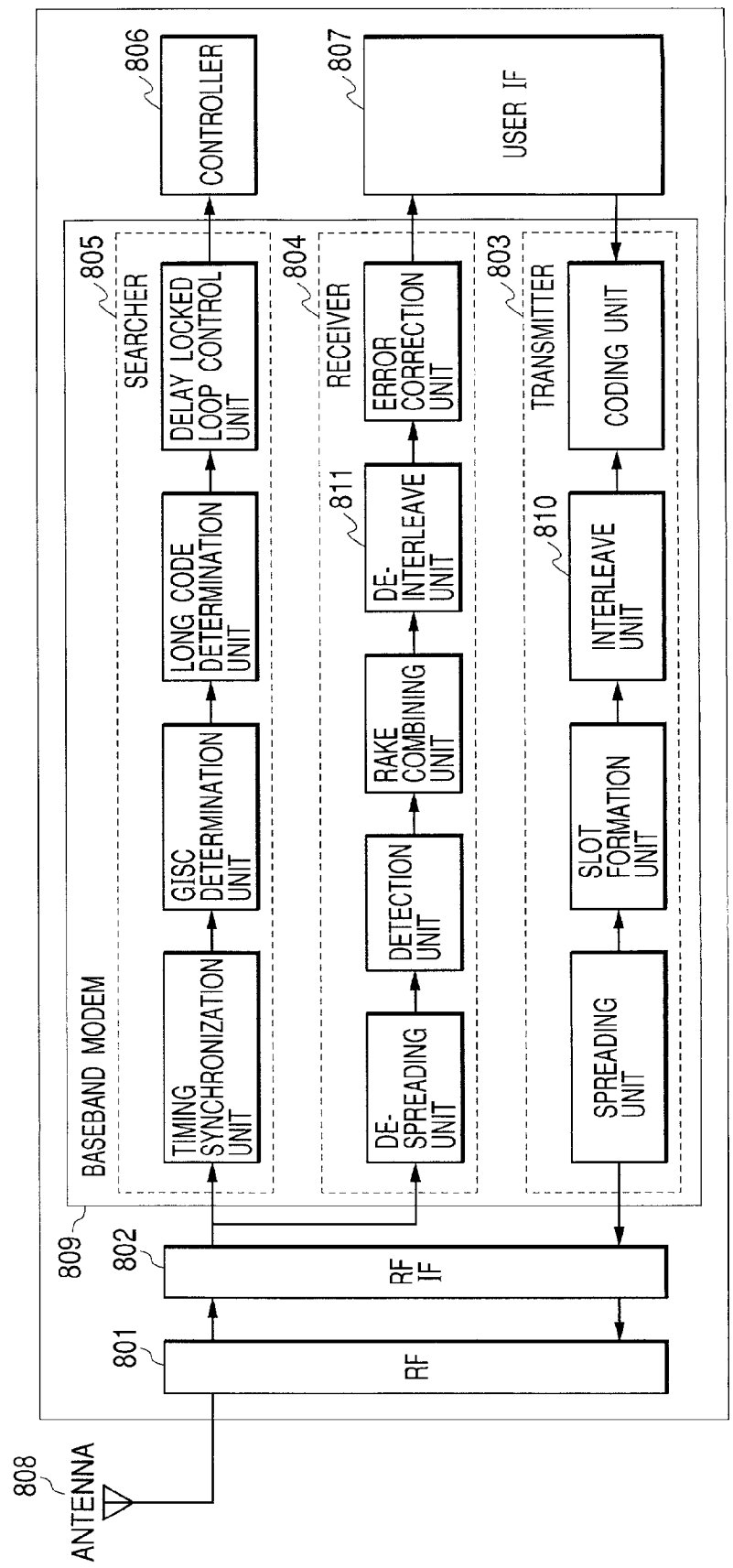
FIG. 8 illustrates a typical configuration of a mobile terminal used in a mobile communication system of the CDMA protocol.

With reference to FIG. 8, the configuration of a mobile terminal used in a mobile communication system supporting the CDMA protocol according to the present invention will be described below. A received signal of a carrier frequency from an antenna 808 is reduced in frequency to the baseband range by an RF unit 801, and the signal then is entered via an interface (IF) unit 802 to a searcher 805 and a receiver 804 within a baseband modulator 809. The communication zone of the searcher 805 varies with initial acquisition and movement of the data and, when the other party to communication is to be handed over to another base station, the system acquires signals from that other base station. The receiver 804 performs despreading, detection, RAKE combination, de-interleaving and error correction. The decoded signal, that has been transmitted, is supplied via a user IF unit 807 to undergo the subsequent processing. The signal to be transmitted to the base station is entered into a transmitter 803 via the user IF unit 807. The transmitter 803 performs coding, interleaving, transmission slot formation and spreading of signals which will be transmitted to the base station. A controller 806 uses a CPU or a DSP to set initial values of different units in FIG. 8 and to manage the timing of the units.

The interleaving processing described above is employed by an interleaver 810 in the baseband modulator 809, and the de-interleaving processing is employed by a de-interleaver 811 in the baseband modulator 809. The baseband modulator 809 can be made on a single LSI.

In this case, the above-described RAM areas may be provided either within the LSI or externally.

Figure 9:
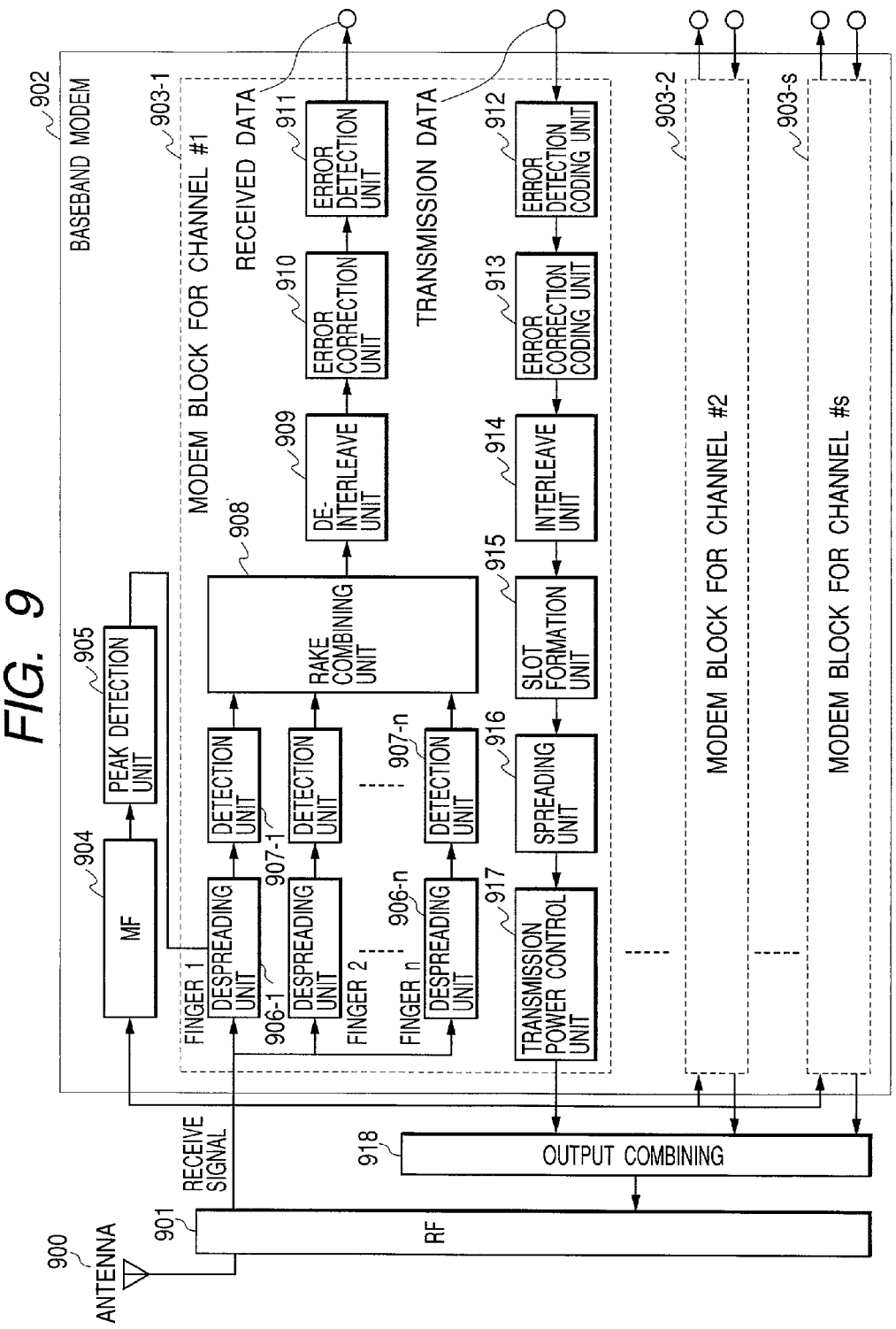
FIG. 9 illustrates a typical configuration of a base station used in the mobile communication system of the CDMA protocol.

Next, the configuration of a base station of the mobile communication system supporting the CDMA protocol is described with reference to FIG. 9. A received signal in the carrier's frequency received by an antenna 900 is converted by an RF unit 901 into a signal in the baseband range, then entered into a baseband modulator 902. The baseband modulator 902 is provided with as many modem blocks 903-1 through 903-$s$, each of which processes transmission/reception over one channel, as the number of channels used by the base station. One pair of a filter (MF) 904 and a matched peak detection unit 905 is shared by a plurality of channels, and intermittently searches the signal detection timing (path) of each channel. The peak detection unit 905 selects the peaks with higher path correlation values supplied from the MF 904. The selected path is set in despreading units 906-1 through 906-$n$ (n is the number of fingers) of the modem block 903-1 through 903-$s$ for the respectively corresponding channels to process despreading for each finger. The results of despreading, after being coordinated in phase by detection units 907-1 through 907-$n$, are combined by a RAKE combining unit 908. The combined data undergo demodulation by a de-interleaver 909, an error correction unit 910, and an error detection unit 911, then supplied toward the communication network. On the other hand, transmitted data received from the communication network are coded by an error detection coding unit 912, an error correction coding unit 913, and an interleaver 914. After that, the data undergo SLOT formation together with control signals including a pilot signal, by a SLOT formation unit 915, then being spread by a spreading unit 916. The power ratios with other channels are adjusted by a transmission power control unit 917. The signals of the baseband of different channels are outputted from the baseband modem 902 right after they are overlapped by an output combining unit 918. The overlapping signals that are converted in transmitted signals of the carrier frequency band by the RF unit 901, and transmitted from the antenna 900.

The interleaving processing described above is employed by the interleaver 914 in the baseband modulator 902, and the de-interleaving processing is employed the de-interleaver 909 in the baseband modulator 902. The baseband modulator 902 can be made on a single LSI. In this case, the above-described RAM areas may be provided either within the LSI or externally. By dividing the RAM for interleaving/de-interleaving processings, which occupies a large proportion of the memory of the baseband modem, into a plurality of areas and using on a time-sharing common areas for reading and writing, the required RAM capacity is reduced, the chip size is compressed, and, accordingly, the manufacturing cost is reduced.

The foregoing invention has been described in terms of preferred embodiments. However, those skilled in the art will recognize that many variations of such embodiments exist. Such variations are intended to be within the scope of the present invention and the appended claims.

What is claimed is:

1. A semiconductor device for improving data interleaving/de-interleaving efficiency, comprising:
   a memory; and
   a control circuit for writing a first set of data into a first area of the memory according to a predetermined interleaving/de-interleaving manner, for reading out a portion of the firstly written data from the first area of the memory, and for writing a portion of a second set of data to be interleaved/de-interleaved right after said first set of data into a portion of the first area of the memory where the read-out portion of said first set of data was written.

2. A semiconductor device for improving data interleaving/de-interleaving efficiency, comprising:
   a memory;
   a writing circuit for writing a first set of data into a first area of the memory according to a predetermined interleaving/de-interleaving manner;
   a reading circuit for reading out a portion of the firstly written data from the first area of the memory; and
   a writing circuit for writing a portion of a second set of data to be interleaved/de-interleaved right after said first set of data into a portion of the first area of the memory where the read-out portion of said first set of data was written.

3. A semiconductor device for improving data interleaving/de-interleaving efficiency, comprising:
   a first memory area;
   a second memory area;
   a third memory area; and
   a control circuit for writing a first set of data into the first memory area and the second memory area according to a predetermined interleaving/de-interleaving manner, for reading out a first portion of the first set of data from the first memory area and a second portion of the first set of data from the second memory area, for writing a second set of data, which will be interleaved/de-interleaved right after said first set of data, into the first memory area after the first portion of said first set of data has been read out from the first memory area.

4. A semiconductor device for improving data interleaving/de-interleaving efficiency, comprising:
   a first memory area;
   a second memory area;
   a third memory area;
   a writing circuit for writing a first set of data into the first memory area and the second memory area according to a predetermined interleaving/de-interleaving manner;
   a reading circuit for reading out a first portion of the first set of data from the first memory area and for reading out a second portion of the first set of data from the second memory area; and
   a writing circuit for writing a second set of data, which will be interleaved/de-interleaved right after said first set of data, into the first memory area after the first portion of said first set of data has been read out from the first memory area.

5. The semiconductor device according to claim 3, wherein the second set of data is written into the third memory area before the second portion of said first set of data has been read out from the second memory area.

6. The semiconductor device according to claim 3, wherein said first memory area is greater than said second memory area, and said first memory area is greater than said third memory area.

7. The semiconductor device according to claim 3, wherein said first memory area, said second memory area and said third memory area are of the same size.

8. The semiconductor device according to claim 3, wherein the first memory area is selected via a frame timing signal or an address signal.

9. The semiconductor device according to claim 4, wherein the second set of data is written into the third memory area before the second portion of said first set of data has been read out from the second memory area.

10. The semiconductor device according to claim 4, wherein said first memory area is greater than said second memory area, and said first memory area is greater than said third memory area.

11. The semiconductor device according to claim 4, wherein said first memory area, said second memory area and said third memory area are of the same size.

12. The semiconductor device according to claim 4, wherein the first memory area is selected via a frame timing signal or an address signal.

13. A communication apparatus comprises an antenna for transmitting and receiving data, and a baseband modulator having at least one semiconductor device for improving data interleaving/de-interleaving efficiency which includes:
   a first memory area;
   a second memory area;
   a third memory area; and
   a control circuit for writing a first set of data into the first memory area and the second memory area according to a predetermined interleaving/de-interleaving manner, for reading out a first portion of the first set of data from the first memory area and a second portion of the first set of data from the second memory area, for writing a second set of data, which will be interleaved/de-interleaved right after said first set of data, into the first memory area after the first portion of said first set of data has been read out from the first memory area.

14. A communication apparatus comprises an antenna for transmitting and receiving data, and a baseband modulator which includes:
   a first memory area;
   a second memory area;
   a third memory area;
   a writing circuit for writing a first set of data into the first memory area and the second memory area according to a predetermined interleaving/de-interleaving manner;
   a reading circuit for reading out a first portion of the first set of data from the first memory area and for reading out a second portion of the first set of data from the second memory area; and
   a writing circuit for writing a second set of data, which will be interleaved/de-interleaved right after said first set of data, into the first memory area after the first portion of said first set of data has been read out from the first memory area.

15. The communication apparatus according to claim 13, wherein the second set of data is written into the third memory area before the second portion of said first set of data has been read out from the second memory area.

16. The communication apparatus according to claim 13, wherein said first memory area is greater than said second memory area, and said first memory area is greater than said third memory area.

17. The communication apparatus according to claim 13, wherein said first memory area, said second memory area and said third memory area are of the same size.

18. The communication apparatus according to claim 13, wherein the first memory area is selected via a frame timing signal or an address signal.

19. The communication apparatus according to claim 14, wherein the second set of data is written into the third memory area before the second portion of said first set of data has been read out from the second memory area.

20. The communication apparatus according to claim 14, wherein said first memory area is greater than said second memory area, and said first memory area is greater than said third memory area.

21. The communication apparatus according to claim 14, wherein said first memory area, said second memory area and said third memory area are of the same size.

22. The communication apparatus according to claim 14, wherein the first memory area is selected via a frame timing signal or an address signal.

23. A communication apparatus comprises an antenna for transmitting and receiving data, and a baseband modulator which includes:
- an interleaving circuit for interleaving to-be-transmitted data, said interleaving circuit further comprises:
- a writing circuit for writing a first set of to-be-transmitted data into a first area of a storage medium according to a predetermined interleaving manner;
- a reading circuit for reading out a portion of the firstly written to-be-transmitted data from the first area of the storage medium; and
- a writing circuit for writing a portion of a second set of to-be-transmitted data which will be interleaved right after said first set of to-be-transmitted data into a portion of the first area of the storage medium where the read-out portion of said first set of to-be-transmitted data was written,
- a transmitter for transmitting the interleaved data between two different locations;
- a receiver for receiving data transmitted between the two different locations; and
- a de-interleaving circuit for de-interleaving the received data, the de-interleaving circuit further comprises:
- a writing circuit for writing a first set of transmitted data into a second area of the storage medium according to a predetermined interleaving manner;
- a reading circuit for reading out a portion of the firstly written transmitted data from the second area of the storage medium; and
- a writing circuit for writing a portion of a second set of transmitted data which will be de-interleaved right after said first set of transmitted data into a portion of the second area of the storage medium where the read-out portion of said first set of transmitted data was written.

24. A communication apparatus comprises an antenna for transmitting and receiving data, and a baseband modulator which includes:
- an interleaving circuit for interleaving to-be-transmitted data, said interleaving circuit further comprises:
- a first memory area;
- a second memory area;
- a third memory area;
- a writing circuit for writing a first set of to-be-transmitted data into the first memory area and the second memory area according to a predetermined interleaving manner;
- a reading circuit for reading out a first portion of the first set of to-be-transmitted data from the first memory area and for reading out a second portion of the first set of to-be-transmitted data from the second memory area; and
- a writing circuit for writing a second set of to-be-transmitted data, which will be interleaved right after said first set of to-be-transmitted data, into the first memory area after the first portion of said first set of to-be-transmitted data has been read out from the first memory area,
- a transmitter for transmitting the interleaved data between two different locations;
- a receiver for receiving data transmitted between the two different locations; and
- a de-interleaving circuit for de-interleaving the received data, the de-interleaving circuit further comprises:
- a fourth memory area;
- a fifth memory area;
- a sixth memory area;
- a writing circuit for writing a first set of transmitted data into the fourth memory area and the fifth memory area according to a predetermined de-interleaving manner;
- a reading circuit for reading out a third portion of the first set of transmitted data from the fourth memory area and for reading out a fourth portion of the first set of to-be-transmitted data from the second memory area; and
- a writing circuit for writing a second set of transmitted data, which will be de-interleaved right after said first set of transmitted data, into the fourth memory area after the third portion of said first set of transmitted data has been read out from the fourth memory area.

25. The communication apparatus according to claim 24, wherein the second set of to-be-transmitted data is written into the third memory area before the second portion of said first set of data has been read out from the second memory area.

26. The communication apparatus according to claim 24, wherein said first memory area is greater than said second memory area, and said first memory area is greater than said third memory area.

27. The communication apparatus according to claim 24, wherein said first memory area, said second memory area and said third memory area are of the same size.

28. The communication apparatus according to claim 24, wherein the first memory area is selected via a frame timing signal or an address signal.

29. The communication apparatus according to claim 24, wherein the second set of transmitted data is written into the sixth memory area before the fourth portion of said first set of data has been read out from the fifth memory area.

30. The communication apparatus according to claim 24, wherein said fourth memory area is greater than said fifth memory area, and said fourth area is greater than said sixth memory area.

31. The communication apparatus according to claim 24, wherein said fourth memory area, said fifth memory area and said sixth memory area are of the same size.

32. The communication apparatus according to claim 24, wherein the fourth memory area is selected via a frame timing signal or an address signal.

33. The communication apparatus according to claim 24, wherein:
- the operating frequency of said baseband modulator is higher than the transmission rate of data transmitted from said antenna.

34. A method for improving data interleaving/de-interleaving efficiency, comprising:
- writing a first set of data into a first area of a storage medium according to a predetermined interleaving/de-interleaving manner;
- reading out a portion of the firstly written data from the first area of the storage medium; and
- writing a portion of a second set of data to be interleaved-interleaved right after said first set of data into a portion of the first area of the storage medium where the read-out portion of said first set of data was written.

35. A method for improving interleaving efficiency of communication data comprises interleaving to-be-transmitted data, and transmitting the interleaved data between two different locations, said interleaving step further comprises:

writing a first set of to-be-transmitted data into a first area of a storage medium according to a predetermined interleaving manner;

reading out a portion of the firstly written to-be-transmitted data from the first area of the storage medium; and writing a portion of a second set of to-be-transmitted data which will be interleaved right after said first set of to-be-transmitted data into a portion of the first area of the storage medium where the read-out portion of said first set of to-be-transmitted data was written.

36. A method for improving de-interleaving efficiency of communication data comprises receiving data transmitted between two different locations, and de-interleaving the received data, the de-interleaving step further comprises:

writing a first set of transmitted data into a first area of a storage medium according to a predetermined de-interleaving manner;

reading out a portion of the firstly written transmitted data from the first area of the storage medium; and writing a portion of a second set of transmitted data which will be de-interleaved right after said first set of transmitted data into a portion of the first area of the storage medium where the read-out portion of said first set of transmitted data was written.

37. A computer program product for improving data interleaving/de-interleaving efficiency, comprising:

a module for writing a first set of data into a first area of a storage medium according to a predetermined interleaving/de-interleaving manner;

a module for reading out a portion of the firstly written data from the first area of the storage medium; and a module for writing a portion of a second set of data to be interleaved/de-interleaved right after said first set of data into a portion of the first area of the storage medium where the read-out portion of said first set of data was written.

38. An apparatus for improving data interleaving/de-interleaving efficiency, comprising:

means for writing a first set of data into a first area of a storage medium according to a predetermined interleaving/de-interleaving manner;

means for reading out a portion of the firstly written data from the first area of the storage medium; and means for writing a portion of a second set of data to be interleaved/de-interleaved right after said first set of data into a portion of the first area of the storage medium where the read-out portion of said first set of data was written.

* * * * *